United States Patent [19]

Aoki et al.

[11] Patent Number: 5,162,676

[45] Date of Patent: Nov. 10, 1992

[54] CIRCUIT HAVING LEVEL CONVERTING CIRCUIT FOR CONVERTING LOGIC LEVEL

[75] Inventors: Kouju Aoki, Inazawa; Hideji Sumi, Kani; Moriaki Mizuno, Nagoya; Tetsuya Aisaka, Kasugai, all of Japan

[73] Assignees: Fujitsu Limited, Kawasaki; Fujitsu VLSI Limited, Kasugai, both of Japan

[21] Appl. No.: 669,987

[22] Filed: Mar. 15, 1991

[30] Foreign Application Priority Data

Mar. 19, 1990 [JP] Japan .................................. 2-69148

[51] Int. Cl.$^5$ ................. H03K 19/0175; H03K 19/20
[52] U.S. Cl. .................... 307/475; 307/450; 307/296.6
[58] Field of Search ............. 307/475, 450, 455, 296.6

[56] References Cited

U.S. PATENT DOCUMENTS

| | | | |
|---|---|---|---|
| 4,410,815 | 10/1983 | Ransom et al. | 307/475 |
| 4,496,856 | 1/1985 | Ransom et al. | 307/448 |
| 4,743,957 | 5/1988 | Hirayama | 307/475 |
| 4,806,800 | 2/1989 | Khan | 307/475 |

FOREIGN PATENT DOCUMENTS

| | | |
|---|---|---|
| 0317145 | 5/1989 | European Pat. Off. . |
| 1277089 | 5/1969 | United Kingdom . |

OTHER PUBLICATIONS

Electronic Design, vol. 26, No. 12, Jun. 7, 1978, p. 146, Rochelle Park, US; S. Barton, "Quad Comparator Provides Two Functions Logic-Level-Shifting and Time Delays", FIG. 2, pp. 146.

Primary Examiner—Edward P. Westin
Assistant Examiner—Andrew Sanders
Attorney, Agent, or Firm—Staas & Halsey

[57] ABSTRACT

A circuit has a level converting circuit for converting a signal having level in conformance with a first logic system into a signal having a level in conformance with a second logic system. The circuit includes first, second and third voltage lines for respectively supplying first, second and third power source voltages, a level converting circuit coupled to the first and third voltage lines for converting a first signal having a level in conformance with the first logic system into a second signal having a level in conformance with the second logic system, a reference voltage generating part coupled to the first and third voltage lines for generating a reference voltage based on at least the first power source voltage, so that the reference voltage undergoes a corresponding level deviation with respect to a level deviation of the second signal caused by a level deviation in the first signal which occurs due to a level deviation in the first power source voltage, and a logic circuit which employs the second logic system and is coupled to the second and third voltage lines for receiving the second signal from the level converting circuit and for outputting an output signal using the reference voltage from the reference voltage generating part as a bias signal. The first power source voltage is a positive voltage relative to the second power source voltage and the third power source voltage is a negative voltage relative to the second power source voltage.

11 Claims, 3 Drawing Sheets

CIRCUIT HAVING LEVEL CONVERTING CIRCUIT FOR CONVERTING LOGIC LEVEL

BACKGROUND OF THE INVENTION

The present invention generally relates to circuit having level converting circuits, and more particularly to a circuit having a level converting circuit suited for converting a logic level used in gallium arsenide (GaAs) devices (hereinafter simply referred to as GaAs logic level) into a logic level of an emitter-coupled logic (ECL) devices (hereinafter simply referred to as ECL level).

In order to realize high-speed operation in systems, there recently are systems which use GaAs devices. However, with the present compound semiconductor technology, it is difficult to form the system solely from GaAs devices. For this reason, there is a demand to use the GaAs devices together with existing ECL circuits or the like which operate at high speeds. In this case, it becomes necessary to use a level converting circuit for converting the GaAs logic level into the ECL level.

Conventionally, when converting the GaAs logic level into the ECL level, a level converting circuit 2 is provided within a GaAs device 1 as shown in FIG. 1. The level converting circuit 2 converts an output level (GaAs logic level) of an internal gate circuit 3 of the GaAs device 1 into the ECL level and supplies the ECL level to an ECL device 4. In other words, the level converting circuit 2 includes two GaAs transistors 5 and 6 which are connected in series between voltage lines $V_{DD}$ and $V_T$, where the voltage line supplies a power source voltage $V_{DD}(+2\text{ V})$ and the voltage line $V_T$ supplies a voltage VT derived from the ECL device 4. A terminal resistor RT is connected in parallel with the GaAs transistor 6, and the ECL level is supplied to the ECL device 4 via the terminal resistor RT.

On the other hand, the ECL device 4 uses three voltages which are a ground voltage (0V), the voltage $V_T$ ($-2$V) and a power source voltage $V_{EE}(-5.2\text{V})$. The ECL level from the level converting circuit 2 is applied to a base terminal of a transistor 8 which is one of emitter-coupled transistors 8 and 9 of an ECL circuit 7 within the ECL device 4. A bias voltage Vref which is generated based on the voltages GND and $V_{EE}$ is applied to a base terminal of the transistor 9.

But according to the level converting circuit 2 provided within the GaAs device 1, it is necessary to set the resistance of the terminal resistor RT to 50 ohms and obtain an amplitude of 0.8V in order to ensure normal operation of the ECL circuit 7. Thus, there are problems in that the power consumption of the GaAs transistors 5 and 6 becomes large and patterns of these GaAs transistors 5 and 6 become large making it difficult to form the circuit in the form of an integrated circuit having a large integration density.

In addition, since the GaAs logic level output from the GaAs internal gate circuit 3 is dependent on the power source voltage $V_{DD}$, the ECL level which is output from the level converting circuit 2 is also dependent on the power source voltage $V_{DD}$. This means that the ECL level applied to the transistor 8 of the ECL circuit 7 is dependent on the power source voltage $V_{DD}$. However, the bias voltage Vref which is applied to the other transistor 9 of the ECL circuit 7 is independent of the power source voltage $V_{DD}$. As a result, there is a problem in that the operating margin of the ECL circuit 7 becomes small and insufficient when the power source voltage $V_{DD}$ undergoes a deviation due to some reason, for example.

The GaAs device 1 is virtually unaffected by a temperature change, but the voltage level within the ECL circuit 7 changes responsive to the temperature change. For this reason, although the ECL level which is applied to the transistor 8 from the GaAs device 1 is virtually unaffected by the temperature change, the reference voltage Vref which is generated within the ECL device 4 undergoes a change responsive to the temperature change and the operating margin of the ECL circuit 7 becomes small with respect to the temperature change. FIG. 2 shows output voltage $V_{OUT}$ versus temperature Ta characteristics of an ECL circuit and a GaAs circuit. In FIG. 2, the dotted line indicates the output voltage $V_{OUT}$ of the ECL circuit which changes at a rate of approximately 1.0 mV/° C., and the solid line indicates the output voltage $V_{OUT}$ of the GaAs circuit which is approximately constant regardless of the temperature.

SUMMARY OF THE INVENTION

Accordingly, it is a general object of the present invention to provide a novel and useful circuit in which the problems described above are eliminated.

Another and more specific object of the present invention is to provide a circuit having a level converting circuit for converting a signal having level in conformance with a first logic system into a signal having a level in conformance with a second logic system, comprising a first voltage line for supplying a first power source voltage, a second voltage line for supplying a second power source voltage, a third voltage line for supplying a third power source voltage, a level converting circuit coupled to the first and third voltage lines for converting a first signal having a level in conformance with the first logic system into a second signal having a level in conformance with the second logic system, reference voltage generating means coupled to the first and third voltage lines for generating a reference voltage based on at least the first power source voltage, so that the reference voltage undergoes a corresponding level deviation with respect to a level deviation of the second signal caused by a level deviation in the first signal which occurs due to a level deviation in the first power source voltage, and a logic circuit which employs the second logic system and is coupled to the second and third voltage lines for receiving the second signal from the level converting circuit and for outputting an output signal using the reference voltage from the reference voltage generating means as a bias signal, where the first power source voltage is a positive voltage relative to the second power source voltage and the third power source voltage is a negative voltage relative to the second power source voltage. According to the circuit of the present invention, it is possible to ensure a sufficient operating margin for the circuit employing the second logic system even with respect to the first signal which is dependent on the first power source voltage, and a stable conversion can be made from the first logic level into the second logic level. In addition, it is possible to effectively compensate for the change in characteristics of the elements forming the circuit employing the second logic system caused by a temperature change by suitably designing the reference voltage generating means.

3

Other objects and further features of the present invention will be apparent from the following detailed description when read in conjunction with the accompanying drawings.

DESCRIPTION OF THE PREFERRED EMBODIMENTS

Figure 3:
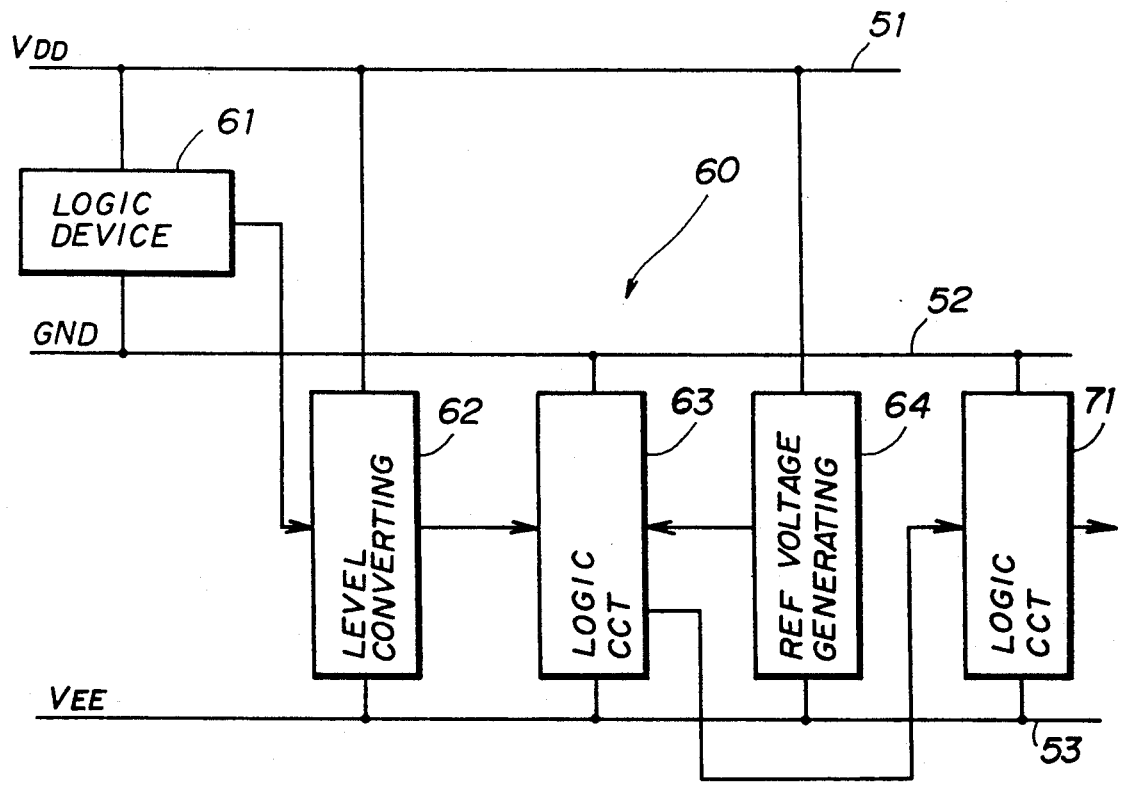
FIG. 3 is a system block diagram for explaining an operating principle of a circuit according to the present invention.

First, a description will be given of an operating principle of a circuit according to the present invention, by referring to FIG. 3. In FIG. 3, a voltage line 51 supplies a first power source voltage $V_{DD}$ from a first power source (not shown), a second voltage line 52 supplies a second power source voltage GND from a second power source (not shown), and a third voltage line 53 supplies a third power source voltage $V_{EE}$ from a third power source (not shown). The first power source voltage $V_{DD}$ is a positive voltage and is $+2V$, for example. The second power source voltage GND is a ground potential and is 0V, for example. The third power source voltage $V_{EE}$ is a negative voltage and is $-5.2V$, for example.

A first logic device 61 employing a first logic system is connected between the first and second voltage lines 51 and 52. A second logic device 60 employing a second logic system is connected to the first logic device 61. For example, the first logic system is the GaAs logic and the second logic system is the ECL.

The second logic device 60 has the circuit according to the present invention which includes a level converting circuit 62, a logic circuit 63, and a reference voltage generating circuit 64. The level converting circuit 62 is connected between the first and third voltage lines 51 and 53. The logic circuit 63 is connected between the second and third voltage lines 52 and 53. The reference voltage generating circuit 64 is connected to the first and third voltage lines 51 and 53.

The level converting circuit 62 converts the logic level of the first logic system output from the first logic device 61 into the logic level of the second logic system, and supplies the converted logic level to the logic circuit 63. The logic circuit 63 receives a reference voltage generated by the reference voltage generating circuit 64, and outputs an output signal to a logic circuit 71 which is provided in a next stage of the second logic device 60.

Both the logic level supplied to the logic circuit 63 from the level converting circuit 62 and the reference voltage supplied to the logic circuit 63 from the reference voltage generating circuit 64 are dependent on the first power source voltage $V_{DD}$ Hence, even when the first power source voltage $V_{DD}$ undergoes a deviation due to some reason, for example, both the output of the level converting circuit 62 and the reference voltage undergo similar changes. In other words, it is possible to ensure a sufficiently large operating margin in the logic circuit 63 even with respect to a signal which is dependent on the first power source voltage $V_{DD}$.

In addition, since the level converting circuit 62 employs the second logic system which is the logic system employed by the reference voltage generating circuit 64, it is also possible to compensate for the voltage deviation within the second logic device 60 caused by a temperature change.

Figure 4:
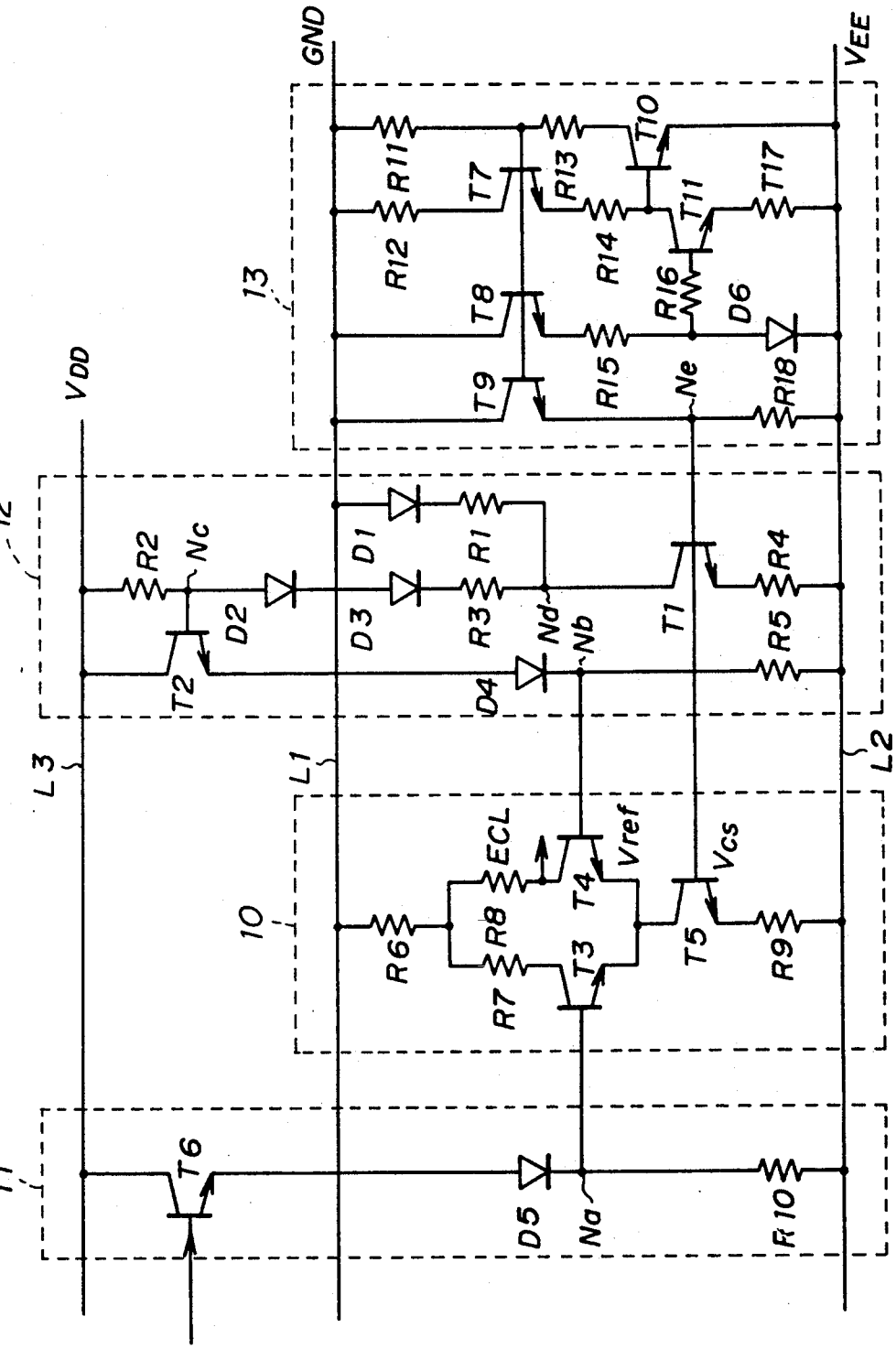
FIG. 4 is a circuit diagram for explaining a first embodiment of the circuit according to the present invention.

Next, a description will be given of an embodiment of the circuit according to the present invention, by referring to FIG. 4. The circuit shown in FIG. 4 is provided on a silicon semiconductor substrate and includes an ECL circuit part 10, an input level shift circuit part 11, and first and second reference voltage generating circuit parts 12 and 13. Voltage lines L1, L2 and L2 respectively supply power source voltages GND, $V_{EE}$ and $V_{DD}$. For example, the power source voltages GND, $V_{EE}$ and $V_{DD}$ respectively are 0V, $-5.2V$ and $+2V$.

The ECL circuit part 10 is provided between the voltage lines L1 and L2, and includes resistors R6 through R9 and transistors T3 through T5. The emitter-coupled transistors T3 and T4 have collectors which respectively coupled to the voltage line GND. The collector of the transistor T3 is coupled to the voltage line GND via the resistors R7 and R6, while the collector of the transistor T4 is coupled to the voltage line GND via the resistors R8 and R6. The emitters of the transistors T3 and T4 are connected to a collector of the transistor T5, and an emitter of the transistor T5 is coupled to the voltage line $V_{EE}$ via the resistor R9. The transistor T5 and the resistor R9 forms a known constant current source. The voltage line L1 is common to all ECL gate circuits within the ECL device and is connected to an external ground terminal in this case. The voltage line L2 is also common to all the ECL gate circuits within the ECL device.

Figure 1:
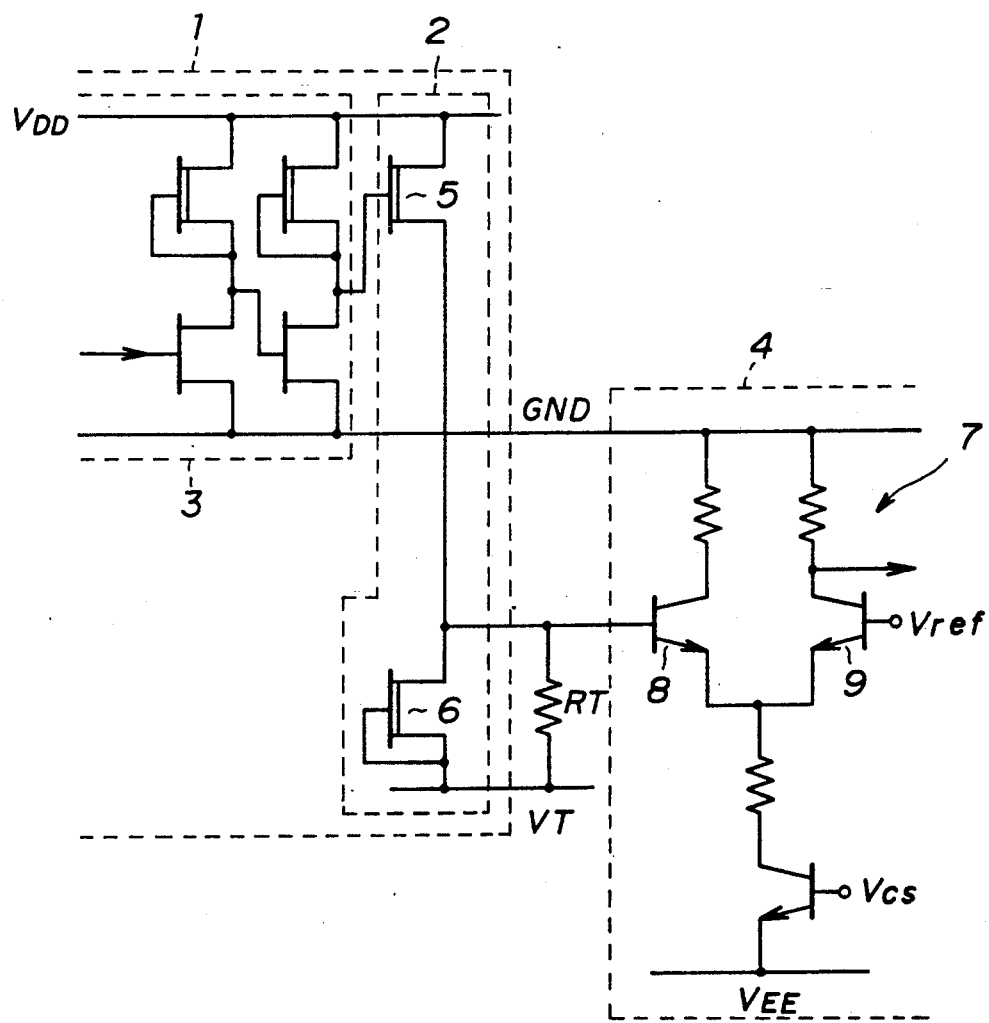
FIG. 1 is a circuit showing for explaining an example of a conventional level converting circuit.
Figure 2:
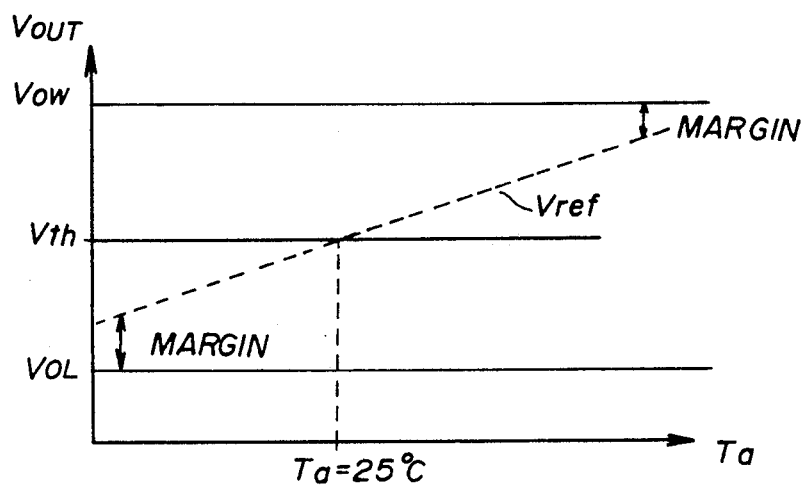
FIG. 2 is a diagram for explaining output voltage versus temperature characteristics of ECL and GaAs circuits.

The level shift circuit part 11 is provided between the voltage lines L3 and L2, and includes a transistor T6, a diode D5 and a resistor R10 which are connected in series between the voltage lines L3 and L2. A node Na connecting the diode D5 and the resistor R10 connects to a base of the transistor T3 within the ECL circuit part 10. A signal which is output from a GaAs device (not shown) such as the GaAs device 1 shown in FIG. 1 and has the GaAs logic level is input to a base of the transistor T6. An ECL level is generated at the node Na based on the GaAs logic level of the signal applied to the base of the transistor T6, and the signal having the ECL level is applied to the base of the transistor T3.

The first reference voltage generating circuit part 12 is made up of a bias voltage circuit, a voltage divider circuit and a clamp circuit. The bias voltage circuit is provided between the lines L3 and L2, similarly to the level shift circuit part 11. The bias voltage circuit includes a transistor T2, a diode D4 and a resistor R5 which are connected in series between the voltage lines L3 and L2. The transistor T2, the diode D4 and the resistor R5 are provided in correspondence with the transistor T6, the diode D5 and the resistor R10 of the level shift circuit part 11. A node Nb which connects the diode D4 and the resistor R5 is connected to a base of the transistor T4 within the ECL circuit part 10.

The voltage divider circuit is provided between the voltage lines L3 and L2, and includes resistors R2 and R3, diodes D2 and D3, and a known constant current source which is made up of a transistor T1 and a resistor R4. A node Nc which connects the resistor R2 and the diode D2 is connected to a base of the transistor T2 of the bias voltage circuit. The diodes D2 and D3 are provided for adjusting temperature coefficients.

The clamp circuit includes a diode D1 and a resistor R1 which are connected in series between the voltage line L1 and a collector of the transistor T1 of the voltage divider circuit. The resistor R1 connects to the resistor R3 and to the collector of the transistor T1 at a node Nd. This clamp circuit clamps the potential at the node Nd to a predetermined potential.

The second reference voltage generating circuit part 13 is provided between the voltage lines L1 and L2, and includes a known constant voltage circuit which is made up of transistors T7 through T11, resistors R11 through R18 and a diode D6. A node Ne which connects the transistor T9 and the resistor R18 is connected to the bases of the transistors T5 and T1. A constant voltage $V_{CS}$ which is independent of the power source voltage $V_{EE}$ on the voltage line L2 is generated at the node Ne, and this constant voltage $V_{CS}$ is applied to the transistors T1 and T5.

When the output signal of the GaAs device 1 having the GaAs logic level is applied to the base of the transistor T6 within the level shift circuit part 11, the GaAs logic level is shifted to the ECL level by the diode D5 between the power source voltages $V_{DD}$ and $V_{EE}$, and the signal having this ECL level is supplied from the node Na to the base of the transistor T3 within the ECL circuit part 10.

On the other hand, a constant current source is formed by the transistor T1 and the resistor R4 of the first reference voltage generating circuit part 12, and the voltage at the node Nd is clamped to a predetermined voltage with reference to the ground GND by the diode D1 and the resistor R1. Hence, the voltage at the node Nc is only dependent on the power source voltage $V_{DD}$ and is determined by a ratio of the resistances of the resistors R2 and R3. The bias voltage Vref having the ECL level is generated by the diode D4 between the power source voltages $V_{DD}$ and $V_{EE}$ based on the voltage at the node Nc, and this bias voltage Vref is applied to the base of the transistor T4 within the ECL circuit part 10.

Accordingly, the bias voltage Vref follows the deviation of the power source voltage $V_{DD}$. As a result, a sufficient operating margin can be ensured for the ECL device even with respect to the GaAs logic level which is dependent on the power source voltage $V_{DD}$, and a stable conversion can be made from the GaAs logic level into the ECL level.

In this embodiment, since the transistor T2 and the diode D4 of the first reference voltage generating circuit part 12 respectively correspond to and have the same characteristics as the transistor T6 and the diode D5 of the level shift circuit part 11, the ECL level signal at the node Na and the ECL level signal at the node Nb undergo approximately the same deviation in response to a temperature change. For this reason, it is possible to effectively compensate for the change in characteristics of the elements forming the ECL device caused by the temperature change.

Further, the present invention is not limited to these embodiments, but various variations and modifications may be made without departing from the scope of the present invention.

What is claimed is:

1. A circuit having a level converting circuit for converting a signal having level in conformance with a first logic system into a signal having a level in conformance with a second logic system, said circuit comprising:
   a first voltage line for supplying a first power source voltage;
   a second voltage line for supplying a second power source voltage which is a ground voltage;
   a third voltage line for supplying a third power source voltage;
   a level converting circuit coupled to said first and third voltage lines for converting a first signal having a level in conformance with the first logic system into a second signal having a level in conformance with the second logic system;
   reference voltage generating means coupled to said first, second and third voltage lines for generating a reference voltage based on at least the first power source voltage, so that the reference voltage undergoes a corresponding level deviation with respect to a level deviation of said second signal caused by a level deviation in said first signal which occurs due to a level deviation in said first power source voltage; and
   a logic circuit which employs the second logic system and is coupled to said second and third voltage lines for receiving the second signal from said level converting circuit and for outputting an output signals using the reference voltage from said reference voltage from said reference voltage generating means as a bias signal,
   said first source voltage being a positive voltage relative to said second power source voltage,
   said third power source voltage being a negative voltage relative to said second power source voltage, and
   said reference voltage generating means including:
      a clamp circuit, coupled to said second voltage line, and having a first node at an output end of said clamp circuit, for clamping a potential at the first node to a negative potential relative to the ground voltage;
      a bias voltage circuit, coupled to said first and third voltage lines, and having a control transistor for generating a bias voltage and a second node coupled to the control transistor; and
      a control voltage generating circuit, including diode means coupled between the first node and said first voltage line, for determining a control voltage which is supplied to the control transistor via the second node,
   said bias voltage being applied to said logic circuit as said reference voltage.

2. The circuit as claimed in claim 1, wherein said first signal is output from a logic circuit which is coupled to said first and second voltage lines.

3. A circuit having a level converting circuit for converting a signal having level in conformance with a first logic system into a signal having a level in conformance with a second logic system, said circuit comprising:
   a first voltage line for supplying a first power source voltage;
   a second voltage line for supplying a second power source voltage;
   a third voltage line for supplying a third power source voltage;
   a level converting circuit, coupled to said first and third voltage lines, for converting a first signal having a level in conformance with the first logic system into a second signal having a level in conformance with the second logic system;

reference voltage generating means, coupled to said first and third voltage lines, for generating a reference voltage based on at least the first power source voltage, so that the reference voltage undergoes a corresponding level deviation with respect to a level deviation of said second signal caused by a level deviation in said first signal which occurs due to a level deviation in said first power source voltage; and a logic circuit which employs the second logic system and is coupled to said second and third voltage lines for receiving the second signal from said level converting circuit and for outputting an output signal using the reference voltage from said reference voltage from said reference voltage generating means as a bias signal, said first source voltage being a positive voltage relative to said second power source voltage, said third power source voltage being a negative voltage relative to said second power source voltage, and said first logic system being gallium arsenide logic an said second logic system being emitter coupled logic (ECL).

4. A circuit having a level converting circuit for converting a signal having level in conformance with a first logic system into a signal having a level in conformance with a second logic system, said circuit comprising:

a first voltage line for supplying a first power source voltage;

a second voltage line for supplying a second power source voltage;

a third voltage line for supplying a third power source voltage;

a level converting circuit coupled to said first and third voltage lines for converting a first signal having a level in conformance with the first logic system into a second signal having a level in conformance with the second logic system;

reference voltage generating means coupled to said first and third voltage lines for generating a reference voltage based on at least the first power source voltage, so that the reference voltage undergoes a corresponding level deviation with respect to a level deviation of said second signal caused by a level deviation in said first signal which occurs due to a level deviation in said first power source voltage; and a logic circuit which employs the second logic system and is coupled to said second and third voltage lines for receiving the second signal from said level converting circuit and for outputting an output signal using the reference voltage from said reference voltage from said reference voltages generating means as a bias signal.

said first source voltage being a positive voltage relative to said second power source voltage, said third power source voltage being a negative voltage relative to said second power source voltage, said level converting circuit including a first transistor, a first diode and a first resistor being connected in series across said first and third voltage lines, said first transistor having a base which receives said first signal, and said second signal being output from a first node which connects said first diode and said first resistor.

5. The circuit as claimed in claim 4, wherein said logic circuit includes emitter-coupled second and third transistors having collectors coupled to said second voltage line, a first constant current source coupled between the emitters of sid second and third transistors and said third voltage line, said second transistor having a base which receives said second signal, said third transistor having a base which receives said reference voltage.

6. The circuit as claimed in claim 5, wherein said reference voltage generating means is further coupled to said second voltage line and includes a voltage divider circuit coupled to said first and third voltage lines and having second and third nodes, a clamp circuit coupled to said second voltage line and said voltage divider circuit for clamping a potential at the third node to a predetermined voltage, and a bias voltage circuit coupled to said first and third voltage lines and said second node for generating a bias voltage at a fourth node, said bias voltage being applied to said logic circuit as said reference voltage.

7. The circuit as claimed in claim 6, wherein said reference voltage generating means further includes a constant voltage source coupled to said second and third voltage lines for supplying a constant voltage to the said first constant current source in said logic circuit and to said voltage divider circuit within said reference voltage generating means.

8. The circuit as claimed in claim 7, wherein said voltage divider circuit includes a second resistor coupled between said first voltage line and said second node, a second constant current source coupled to said third voltage line, and diode means and a third resistor coupled in series between said second resistor and said second constant current source, said second constant current source receiving the constant voltage generated by said constant voltage source.

9. The circuit as claimed in claim 6, wherein said bias circuit includes a fourth transistor, a second diode and a third resistor which are connected in series across said first and third voltage lines, said fourth transistor having a base which is connected to said second node, and said reference voltage is output from said fourth node which connects said second diode and said third resistor.

10. The circuit as claimed in claim 9, wherein said first transistor, said first diode and said first resistor respectively have approximately the same characteristics as said fourth transistor, said second diode and said third resistor.

11. The circuit as claimed in claim 1, which further comprises another logic circuit coupled to said second and third voltage lines for receiving the output signal of said logic circuit.

* * * * *

UNITED STATES PATENT AND TRADEMARK OFFICE
CERTIFICATE OF CORRECTION

PATENT NO. : 5,162,676
DATED : November 10, 1992
INVENTOR(S) : Kouju AOKI et al.

It is certified that error appears in the above-identified patent and that said Letters Patent is hereby corrected as shown below:

Column 3, line 7, change "circuit showing" to --circuit diagram showing--;

Column 3, line 63, change "$V_{DD}$ Hence," to --$V_{DD}$. Hence,--.

Column 6, line 28, change "signals" to --signal--.

Column 7, line 26, change "an" to --and--.

Signed and Sealed this

Twenty-sixth Day of October, 1993

Attest:

BRUCE LEHMAN

*Attesting Officer*  *Commissioner of Patents and Trademarks*